United States Patent
Koyama et al.

(10) Patent No.: US 7,064,023 B2
(45) Date of Patent: Jun. 20, 2006

(54) D/A CONVERTER CIRCUIT, SEMICONDUCTOR DEVICE INCORPORATING THE D/A CONVERTER CIRCUIT, AND MANUFACTURING METHOD OF THEM

(75) Inventors: Jun Koyama, Sagamihara (JP); Hiroyuki Miyake, Atsugi (JP); Kei Takahashi, Atsugi (JP); Kazuhiko Miyata, Habikino (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 124 days.

(21) Appl. No.: 10/823,745

(22) Filed: Apr. 14, 2004

(65) Prior Publication Data

US 2004/0201509 A1    Oct. 14, 2004

(30) Foreign Application Priority Data

Apr. 14, 2003    (JP)    ............................. 2003-108667

(51) Int. Cl.
*H01L 21/84*    (2006.01)

(52) U.S. Cl. ........................................ 438/166; 438/382
(58) Field of Classification Search ................ 438/166, 438/382
See application file for complete search history.

(56) References Cited

U.S. PATENT DOCUMENTS

| | | | |
|---|---|---|---|
| 5,365,875 A | 11/1994 | Asai et al. | |
| 5,413,958 A | 5/1995 | Imahashi et al. | |
| 5,432,122 A | 7/1995 | Chae | |
| 5,589,406 A | 12/1996 | Kato et al. | |
| 5,624,851 A * | 4/1997 | Takayama et al. | .......... 438/166 |
| 6,096,581 A | 8/2000 | Zhang et al. | |
| 6,303,963 B1 * | 10/2001 | Ohtani et al. | ................ 257/350 |
| 6,380,876 B1 | 4/2002 | Nagao | |
| 6,420,988 B1 | 7/2002 | Azami et al. | |
| 6,512,469 B1 | 1/2003 | Azami et al. | |
| 6,606,045 B1 | 8/2003 | Azami et al. | |
| 6,693,616 B1 | 2/2004 | Koyama et al. | |
| 2001/0010512 A1 | 8/2001 | Azami | |
| 2001/0017618 A1 | 8/2001 | Azami | |
| 2001/0048408 A1 | 12/2001 | Koyama et al. | |
| 2002/0163457 A1 | 11/2002 | Azami et al. | |

FOREIGN PATENT DOCUMENTS

| | | |
|---|---|---|
| JP | 2000-138586 | 5/2000 |
| JP | 2000-341125 | 12/2000 |

* cited by examiner

*Primary Examiner*—Chandra Chaudhari
(74) *Attorney, Agent, or Firm*—Eric J. Robinson; Robinson Intellectual Property Law Office, P.C.

(57) ABSTRACT

D/A conversion having higher accuracy is provided by improving relative accuracy of the resistance value of resistors which configure a resistor string. A manufacturing method of a D/A converter circuit of the invention comprises the steps of: forming a resistor string 11 which includes a plurality of resistors R0 to R7 connected in series with each other between reference voltages, and a plurality of switching elements S0 to S3 connected with each connection node of the resistors R0 to R7, wherein: each of the resistors R0 to R7 is a thin film element crystallized by linear laser irradiation; disposing all forming parts of the resistors configuring the resistor string 11 within a laser irradiation area 19; and crystallizing all the forming parts of the resistors which are disposed within the laser irradiation area with the same laser shot.

28 Claims, 13 Drawing Sheets

D/A CONVERTER CIRCUIT, SEMICONDUCTOR DEVICE INCORPORATING THE D/A CONVERTER CIRCUIT, AND MANUFACTURING METHOD OF THEM

BACKGROUND OF THE INVENTION

Field of the Invention

The present invention relates to a D/A converter (digital-to-analog converter) circuit (DAC) of a resistor string type and a semiconductor device incorporating the D/A converter circuit, and more particularly to a manufacturing method of them.

In recent years, liquid crystal display devices using low-temperature polysilicon TFTs or CGS (Continuous Grain Silicon) which realize high definition image displays at high response speed have been used as mobile display devices such as cellular phones, laptop personal computers, PDAs (Personal Digital Assistants) for their thin shapes, light weight, low power consumption, and the like.

Thus far, in a semiconductor device having a display function, which is applicable to such a display device as described above, an audio circuit which requires a D/A conversion function and the like has been fabricated separately from a display device by using an LSI. In this case, an accurate D/A conversion is secured by using an LSI chip, whereas a printed circuit board is also required at an external part of the display device, thereby disturbing downsizing and a thin shape of the display device. Meanwhile, a semiconductor device having a D/A conversion function as well as a display function as shown in FIG. 10 has been manufactured (see patent document 1, for example). This D/A converter circuit is the one in which a voltage between reference voltages $V_H$ and $V_L$ is divided according to the total capacitance ratio, and the accuracy of each capacitance of a capacitor influences the whole accuracy. However, it processes video signals of around 8 bits at most, and there has provided no D/A converter circuit that processes signals of large bits for an audio circuit.

As the digital audio technology advances, storage of sound, communication mediums, and the like have been digitalized, and development of a D/A converter circuit (hereinafter referred to as DAC) having higher performance is an essential subject for converting digital data into analog data. As shown in FIG. 11, there is known a resistor string DAC 300 which comprises a resistor string 200 connected between two reference voltages Vr and Vs. The resistor string 200 comprises resistors (unit resistors) 301 to N each formed by using an impurity diffusion layer in a semiconductor thin film or a polysilicon film. This type of DAC is suitably applied to small mobile devices in particular as it occupies small space (see patent document 2, for example).

[patent document 1]
Japanese Patent Laid-Open No. 2000-341125
[patent document 2]
Japanese Patent Laid-Open No. 2000-138586

SUMMARY OF THE INVENTION

However, the accuracy of the above-described resistor string DAC depends on the manufacturing error of the resistors. That is, when resistors have a manufacturing error in resistance value, the error develops in the resistor string, thus becomes impossible to keep the accuracy of the DAC sufficiently. In particular, in the semiconductor device using low temperature polysilicon TFTs, a semiconductor film is crystallized by laser irradiation so as to form each resistor of the resistor string DAC. Employed here is a laser irradiation apparatus of pulse oscillation as shown in FIG. 12, which comprises a laser irradiation area 450 having a linear shape (or a rectangular shape) in rough. By irradiating intermittent laser shots while scanning the laser irradiation area 450 in the scanning direction (direction of an arrow in the figure), a predetermined crystallization area 460 in a semiconductor thin film is crystallized. As the laser irradiation area 450 generally has a width in the range from several hundreds µm to several mm, and the feeding pitch of a scan per laser shot is around several tens µm, one point is irradiated with 10 to 100 shots. It is to be noted that, the size of the laser irradiation area shown in FIG. 12 or in other figures is only an example, and thus the relationship between the size of the laser irradiation area and the resistors may be different in practice as long as it can achieve the objects of the invention.

Irradiation energy of a laser beam (laser beam output) is ideally the same in every shot, however in practice, it generally varies in each shot due to the variations in laser beam oscillation. FIG. 12 shows, for ease of description, a resistor string 300 that is formed later. A plurality of resistors X1 to X7 which are located in the laser irradiation area 450 are each irradiated with a laser beam uniformly, thus they roughly have the same resistance value, whereas other resistors which are located in the outside of the laser irradiation area 450 are irradiated with other laser beams, thus they do not necessarily have the same resistance value as that of the resistors X1 to X7.

Accordingly, the resistors which are crystallized with a plurality of laser shots will have variations in resistance value, and in the case of using a DAC which has such a resistor string, problems may arise such as the deterioration of an output linearity when data is required to be processed with high accuracy (when the number of bits is large). Each laser shot has variations of several % in energy, which means resistance in different laser shot areas may have variations of 10%.

When the resistor configuration and the laser shot as shown in FIG. 12 are employed, linearity is lost as shown in FIG. 13. Thus, resistor string DACs which are applied the conventional laser crystallization cannot meet the performance requirements sufficiently.

The invention has been made to solve the foregoing problems of the conventional technology, and it is a primary object of the invention to improve relative accuracy of a resistance value of each resistor which configures a resistor string in order to provide a D/A converter circuit capable of processing data of larger bits with high accuracy without a data inversion problem and the like, and a semiconductor device incorporating the D/A converter circuit, and further to provide a manufacturing method of them.

To solve the foregoing problems, the manufacturing method of a D/A converter circuit of the invention comprises the steps of: forming a resistor string, which includes a plurality of resistors connected in series with each other between reference voltages, and a plurality of switching elements connected with each connection node of the resistors, wherein each of the resistors is a thin film element crystallized by linear laser irradiation; disposing all forming parts of the resistors configuring the resistor string within a laser irradiation area; and crystallizing all the forming parts of the resistors which are disposed within the laser irradiation area with the same laser shot.

Accordingly, the forming parts of the resistors (namely, parts of a semiconductor film which are patterned to form each resistor) which are disposed within the predetermined laser irradiation area of a linear laser beam are irradiated with the same laser shot by uniform energy, thus each resistor in the resistor string is uniformly crystallized, and resistance variations can thus be prevented. Accordingly, relative accuracy between each resistor is improved, and a sufficient linearity can be obtained in an output voltage which comes from each connection node through a switching element, thus a favorable D/A conversion can be obtained without a data inversion problem and the like even when data of larger bits is processed.

The manufacturing method of a D/A converter circuit of the invention, further comprises the steps of: forming a resistor string which includes a plurality of resistor groups connected in series with each other between reference voltages; forming a plurality of resistors so as to be connected in series with each other to configure each of the resistor groups; forming a plurality of switching elements connected with each connection nodes of the resistors, wherein each of the resistors is a thin film element crystallized by linear laser irradiation; disposing forming parts of the series-connected resistors of each resistor group within each different laser irradiation area; crystallizing all the forming parts of the resistors which are disposed within the laser irradiation area with the same laser shot; and disposing auxiliary resistors so as to be connected in parallel with each resistor group, wherein each of the auxiliary resistors has the same value that is sufficiently smaller than the combined resistance value of the resistor group to which each auxiliary resistor is connected.

Accordingly, in the formation of the resistors, the forming parts of the resistors, which are all disposed within the predetermined laser irradiation area of a linear laser beam, are irradiated with the same laser shot by uniform energy, thus each resistor in the same resistor group is crystallized uniformly, and resistance variations can thus be prevented.

Also, as the series-connected resistors in each resistor group are each connected in parallel with the auxiliary resistor having the sufficiently smaller resistance value than the combined resistance value of the resistors, the resistance value between both ends of each resistor group (namely, the combined resistance value of the series-connected resistors and the auxiliary resistor connected in parallel with the resistors) is determined, in practice, by the resistance value of the auxiliary resistor. In addition, as the resistance of each auxiliary resistor is previously set to have the same guaranteed value in practice, the resistance between both ends of each resistor group can have the same value. That is, although the combined resistance value of the resistors configuring each resistor group may vary from each other as each resistor group is irradiated with different irradiation energy by using different laser shots, the difference of the resistance value between each resistor group can be compensated by using the auxiliary resistors and applying a steady voltage to both ends of each resistor group.

Accordingly, when the resistance value of each resistor in the same resistor group is identical to each other, a sufficient linearity can be obtained in an output voltage which comes from the connection node of each resistor, thus a favorable D/A conversion can be obtained even when data of larger bits is processed. For example, when a more accurate D/A conversion function is required, the number of resistors configuring a resistor string becomes large, thus it becomes difficult to apply annealing to all the resistors configuring the resistor string with uniformity by use of one laser shot. However, the invention can be efficiently used for such a case.

It is to be noted that, when the resistance value of the auxiliary resistors which are connected with each resistor group are set to be substantially identical to each other, the resistance value of each resistor group is required to be small enough to be regarded as having the same function as that of the D/A converter circuit (namely, so that the combined resistance value of the resistors configuring the resistor group can be ignored).

The manufacturing method of a D/A converter circuit described above, in which each of the auxiliary resistors is a thin film element crystallized by laser irradiation, comprises the step of disposing auxiliary resistors, which includes a step of disposing all the forming parts of the auxiliary resistors within the laser irradiation area and a step of crystallizing all the forming parts of the auxiliary resistors which are disposed within the laser irradiation area with the same laser shot.

Accordingly, the forming parts (namely, parts of a semiconductor film which are patterned to form each auxiliary resistor) of the auxiliary resistors which are all disposed within the predetermined laser irradiation area of a linear laser beam are irradiated with uniform energy by using the same laser shot, thus all the auxiliary resistors are uniformly crystallized, and resistance variations can thus be prevented. Thus, auxiliary resistors each having the same resistance value can be easily formed. In addition, as the auxiliary resistors can be formed on the same semiconductor film as other resistors and switching elements, a D/A converter circuit can further be miniaturized.

According to the manufacturing method of a D/A converter circuit described above, each forming part of the resistors is disposed to be parallel with each other, and also to be parallel with the scan direction of the linear laser irradiation.

Accordingly, the size of the resistor string can be reduced in the vertical direction to the longitudinal direction of each resistor (namely, the longitudinal direction of the resistor string), thus it becomes possible to dispose the resistors configuring the resistor string within the predetermined laser irradiation area with ease, leading to the further miniaturization of the D/A converter circuit.

The manufacturing method of a D/A converter circuit of the invention, further comprises the steps of: forming a resistor string which includes a plurality of resistors connected in series with each other between reference voltages, and a plurality of switching elements connected with each connection node of the resistors, wherein each of the resistors is a thin film element crystallized by laser irradiation; disposing all forming parts of the resistors configuring the resistor string within a laser irradiation area; and crystallizing all the forming parts of the resistors which are disposed within the laser irradiation area with the one laser shot.

Accordingly, in the formation of the resistors, the forming parts of the resistors which are all disposed within the irradiation area of a planar laser beam, which is capable of crystallizing a square or a close-square rectangular area with one shot, are irradiated with one shot by uniform energy, thus all the resistors in the resistor string are uniformly irradiated and resistance variations can thus be prevented. Accordingly, relative accuracy between each resistor is improved, and a sufficient linearity can be obtained in an output voltage which comes from each connection node through a switching element, thus a favorable D/A conversion can be obtained without a data inversion problem and the like even when data of larger bits is processed.

The manufacturing method of a D/A converter circuit of the invention, further comprises the steps of: forming a resistor string which includes a plurality of resistor groups connected in series with each other between reference voltages; forming a plurality of resistors so as to be connected in series with each other to configure each of the resistor groups; forming a plurality of switching elements connected with each connection node of the resistors, wherein each of the resistors is a thin film element crystallized by laser irradiation; disposing forming parts of the series-connected resistors of each resistor group within each different laser irradiation area; crystallizing all the forming parts of the resistors which are disposed within the laser irradiation area with the same laser shot; and disposing auxiliary resistors so as to be connected in parallel with each resistor group, wherein each of the auxiliary resistors has the resistance same value that is sufficiently smaller than the combined resistance value of the resistor group to which each auxiliary resistor is connected.

Accordingly, in the formation of the resistors, the forming parts of the resistors which are all disposed within the irradiation area of a planar laser beam, which is capable of crystallizing a square or a close-square rectangular area with one shot, are irradiated with one shot by uniform energy, thus all the resistors configuring the same resistor group are uniformly irradiated and resistance variations can thus be prevented.

Also, as the series-connected resistors in each resistor group are connected in parallel with each of the auxiliary resistors having the sufficiently smaller resistance value than the combined resistance value of the resistor group, the resistance value between both ends of each resistor group is determined, in practice, by the resistance value of the auxiliary resistor. In addition, as the resistance of each auxiliary resistor is previously set to have the same guaranteed value in practice, the resistance between both ends of each resistor group can have the same value. That is, although the combined resistance value of the resistors configuring each resistor group may vary from each other as each resistor group is irradiated with different irradiation energy by using different laser shots, the difference of the resistance value between each resistor group can be compensated by using the auxiliary resistors and applying a steady voltage to both ends of each resistor group. Accordingly, when the resistance value of each resistor in the same resistor group is identical to each other, a sufficient linearity can be obtained in an output voltage which comes from the connection node of each resistor, thus a favorable D/A conversion can be obtained even when data of larger bits is processed.

The manufacturing method of a D/A converter circuit described above, in which each of the auxiliary resistors is a thin film element crystallized by laser irradiation, comprises the step of disposing auxiliary resistors, which includes a step of disposing all the forming parts of the auxiliary resistors within the laser irradiation area and a step of crystallizing all the forming parts of the auxiliary resistors which are disposed within the laser irradiation area with the same laser shot.

Accordingly, in the formation of the auxiliary resistors, the forming parts of the auxiliary resistors which are all disposed within the irradiation area of a planar laser beam, which is capable of crystallizing a square or a close-square rectangular area with one shot, are irradiated with one shot by uniform energy, thus all the auxiliary resistors are uniformly crystallized, and resistance variations can thus be prevented. Thus, auxiliary resistors each having the same resistance value can be easily formed. In addition, as the auxiliary resistors can be formed on the same semiconductor film as other resistors and switching elements, a D/A converter circuit can further be miniaturized.

According to the manufacturing method of a D/A converter circuit described above, each forming part of the resistors is disposed to be parallel with each other.

Accordingly, the size of the resistor string can be reduced in the vertical direction to the longitudinal direction of each resistor, thus it becomes possible to dispose the resistors configuring the resistor string within the predetermined laser irradiation area with ease, leading to the further miniaturization of the D/A converter circuit.

According to the manufacturing method of a D/A converter circuit described above, each forming part of the resistors is all formed to have the same shape. Thus, it becomes possible to dispose a plurality of resistors configuring each resistor string within the irradiation area of a laser beam with ease.

The D/A converter circuit of the invention comprises: a resistor string which includes a plurality of resistors connected in series with each other between reference voltages; and a plurality of switching elements connected with each connection node of the resistors, wherein: each of the resistors is a thin film element crystallized by linear laser irradiation; all forming parts of the resistors configuring the resistor string are disposed within a laser irradiation area; and all the forming parts of the resistors which are disposed within the laser irradiation area are irradiated with one laser shot.

The D/A converter circuit of the invention, further comprises: a resistor string which includes a plurality of resistor groups connected in series with each other between reference voltages; a plurality of resistors which are connected in series with each other to configure each of the resistor groups; and a plurality of switching elements connected with each connection node of the resistors, wherein: each of the resistors is a thin film element crystallized by linear laser irradiation; all forming parts of the resistors configuring the resistor string are disposed within a laser irradiation area; and all the forming parts of the resistors disposed within the laser irradiation area are irradiated with one laser shot; auxiliary resistors are each disposed to have parallel connection with the resistor groups; and each of the auxiliary resistors has the sufficiently smaller resistance value than the combined resistance value of each resistor group to which the auxiliary resistor is connected.

According to the D/A converter circuit described above, each of the auxiliary resistors is a thin film element crystallized by laser irradiation, all the forming parts of the auxiliary resistors are disposed within a laser irradiation area, and all the forming parts of the auxiliary resistors, which are disposed within the laser irradiation area, are crystallized with the same laser shot.

According to the D/A converter circuit described above, each forming part of the resistors is disposed to be parallel with each other, and also to be parallel to the scan direction of the linear laser irradiation.

The D/A converter circuit of the invention, further comprises: a resistor string which includes a plurality of resistors connected in series with each other between reference voltages; and a plurality of switching elements connected with each connection node of the resistors, wherein: each of the resistors is a thin film element crystallized by laser irradiation; all forming parts of the resistors configuring the resistor string are disposed within a laser irradiation area; and all the forming parts of the resistors which are disposed within the laser irradiation area are irradiated with one laser shot.

The D/A converter circuit of the invention, further comprises: a resistor string which includes a plurality of resistor groups connected in series with each other between reference voltages; a plurality of resistors which are connected in series with each other to configure each of the resistor groups; and a plurality of switching elements connected with each connection node of the resistors, wherein: each of the resistors is a thin film element crystallized by linear laser irradiation; all forming parts of the resistors configuring the resistor string are disposed within a laser irradiation area; and all the forming parts of the resistors which are disposed within the laser irradiation area are irradiated with one laser shot; auxiliary resistors are each disposed to have parallel connection with the resistor groups; and each of the auxiliary resistors has the same resistance value that is sufficiently smaller than the combined resistance value of each resistor group to which the auxiliary resistor is connected.

According to the D/A converter circuit described above, each of the auxiliary resistors is a thin film element crystallized by laser irradiation, all the forming parts of the resistors are disposed within the laser irradiation area, and all the forming parts which are disposed within the laser irradiation area are crystallized with one laser shot.

Also, according to the D/A converter circuit described above, each forming part of the resistors is disposed to be parallel with each other.

Further, according to the D/A converter circuit described above, each forming part of the resistors has the same shape.

Further, according to the D/A converter circuit described above, the resistors are connected with each other by using metal wirings having the same resistance value as those of the resistors. Accordingly, data can be processed favorably without being influenced by the resistance value of each metal wiring which connects each resistor even when the resistor has a small resistance value.

Linear laser beam means a beam that is converged by an optical system into a linear shape to have a length of 100 mm or more in the irradiation surface. It is to be noted that, the "linear shape" termed in this specification indicates not a "line" in the strict sense but a rectangular shape (or an oblong shape) having a high aspect ratio. For example, it indicates a shape having an aspect ratio of 2 or more (preferably, 10 to 10000), and laser beams having rectangular shapes in the irradiation surface are, not to mention, included in it.

DETAILED DESCRIPTION OF THE PREFERRED EMBODIMENTS

Hereinafter described in detail are embodiments of the present invention with reference to the accompanying drawings.

Figure 1:
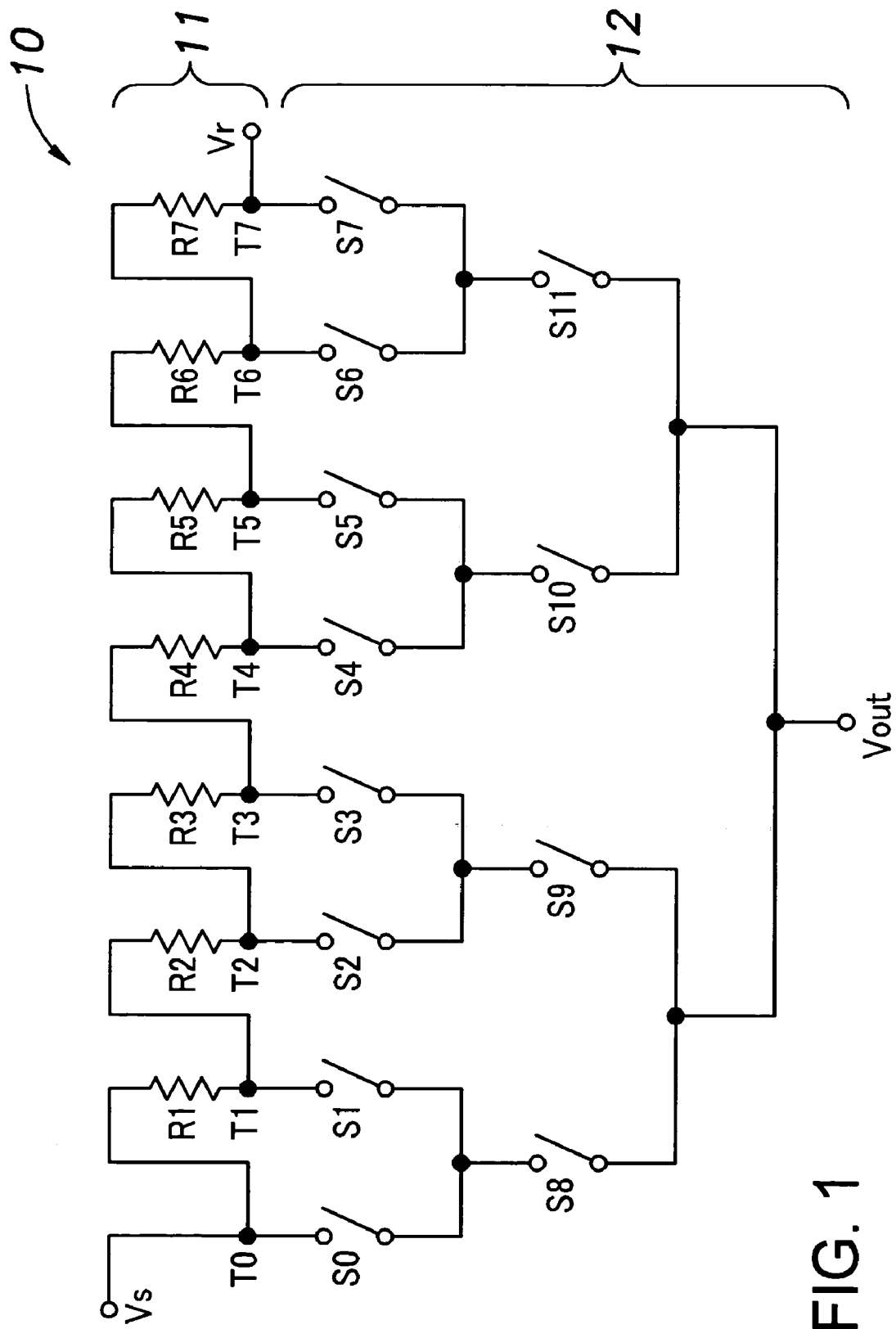
FIG. 1 is a pattern diagram showing the configuration of a DAC as an embodiment of the invention.

FIG. 1 is a diagram showing the schematic configuration of a DAC as an embodiment of the invention. Described here is an example in which a DAC that processes 3-bit data is employed for ease of description, however, an alternate DAC that processes data of larger bits can be employed as well. The DAC 10 comprises a resistor string 11 which includes a plurality of resistors R1 to R7 connected in series with each other between reference voltages Vr and Vs. It further comprises a switch array 12 which includes a plurality of switching elements S0 to S13 to receive potentials from each connection node T0 to T7 of the resistor elements. It is to be noted that, other constituent elements (a controller circuit of a switching element, an amplifier circuit, an input terminal, and the like) that are used in the conventional DAC are omitted here. In addition, although the switching elements S0 to S13 in the switch array 12 has a tree configuration, the invention is not particularly limited to this, and other configurations can be employed as well. As a switching element, for example, a MOSFET can be employed.

In the DAC 10, ON/OFF of the switching elements S0 to S13 that are appropriately selected based on a digital input is controlled in the same manner as in the conventional DACs, and when potentials at the connection nodes T0 to T7 are outputted to an analog output terminal Vout, a corresponding analog output can be obtained.

Figure 2:
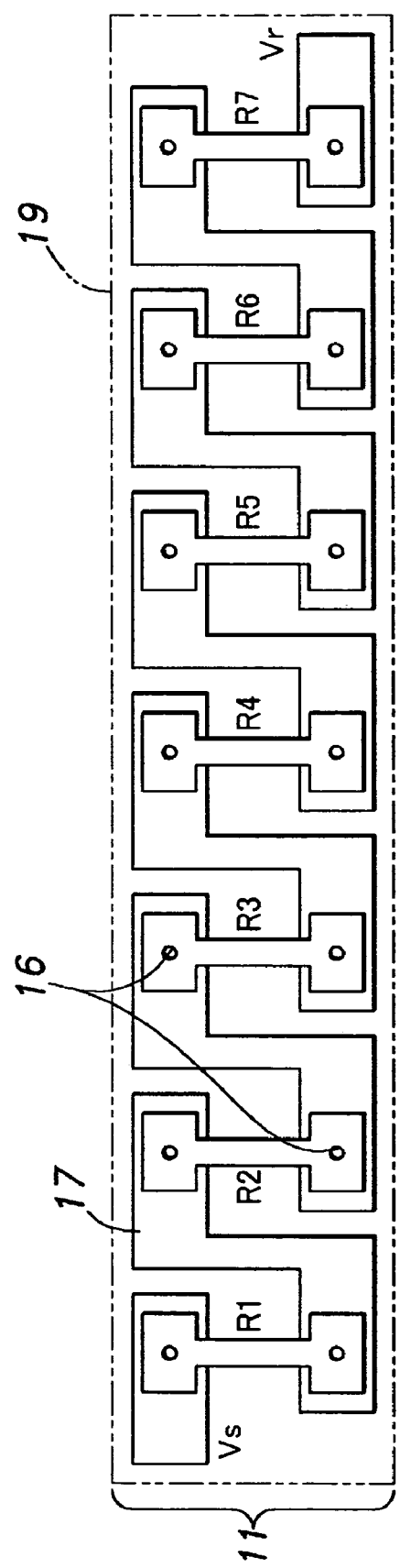
FIG. 2 is a diagram showing the detailed configuration of a resistor string of the DAC shown in FIG. 1.

FIG. 2 is a diagram showing the detailed configuration of the resistor string shown in FIG. 1. Each of the resistors R1 to R7 made of polysilicon is provided with contact holes 16 and they are connected with each other by Al wirings (Al electrodes) 17.

A manufacturing method of such a resistor string 11 is briefly explained. Although each of the resistors R1 to R7 which configures the resistor string 11 is formed by crystallizing a predetermined area of a semiconductor thin film by laser irradiation in this embodiment, they can also be formed by the same formation method of a normal TFT (thin film transistor) unless specified in this specification. The same applies to the switching elements S0 to S13.

First, forming parts of each resistor R1 to R7 (namely, a part to be patterned so as to form each resistor in a semiconductor film) are disposed. Each of them has a rectangular shape in general, and is disposed in parallel with each other in the longitudinal direction of each forming part so as to reduce the size of the resistor string 11 in the longitudinal direction (here, the direction in which two reference voltages Vr and Vs are connected with each other). According to the configuration as described above, it becomes possible to dispose the forming parts of the larger number of resistors within a predetermined linear laser irradiation area 19.

Next, the forming parts of the resistors R1 to R7 which are disposed within the linear laser irradiation area 19 are irradiated with the same linear laser shot (namely, a shot which can irradiate all the forming parts with rough uniformity in each linear laser irradiation although one point is irradiated with a plurality of linear shots by moving the position as described above). Accordingly, all the resistors are crystallized uniformly, and the formed resistors can obtain sufficient relative accuracy. It is to be noted that, by configuring each Al wiring 17 to have the same resistance value to those of the resistors, data can be processed favorably without being influenced by the resistance value of the Al wiring 17 even when each resistor R1 to R7 has a small resistance value. In this manner, the forming parts of the resistors in the laser irradiation area can be irradiated with the same shot by linear laser irradiation. Irradiation characteristics of a laser beam (including a shape or size of an irradiation area) are peculiar to a laser irradiation apparatus that is used, thus the configuration of the resistors in the resistor string that are uniformly crystallized is not particularly limited to the one shown in FIG. 2.

Figure 3:
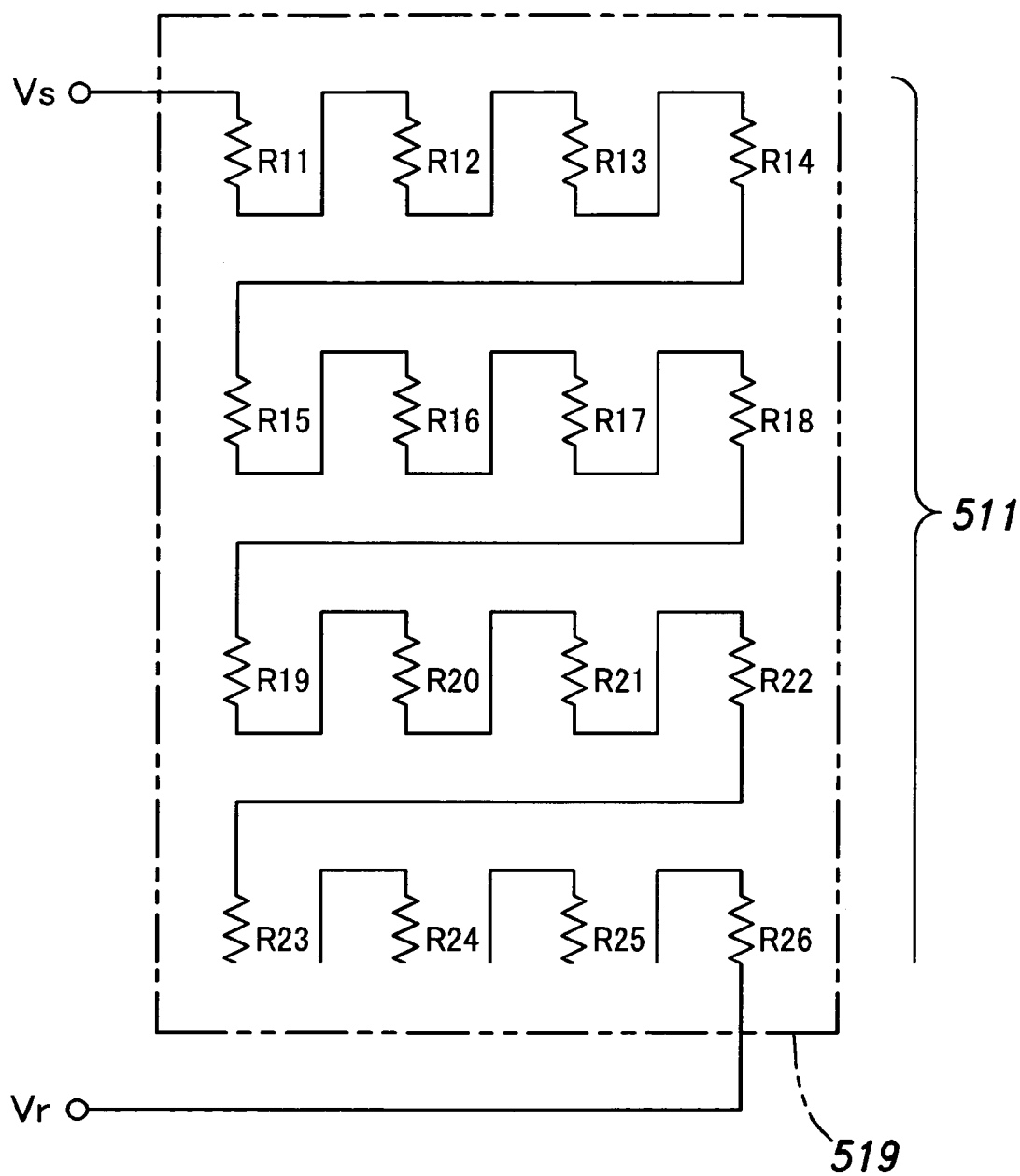
FIG. 3 is a diagram showing a modified example of the resistor string of the DAC shown in FIG. 1.

Thus, an example, in which a planar laser beam capable of crystallizing a square or a close-square rectangular area with one shot is employed, is shown next in place of the above-described linear laser beam. The planar laser beam has an irradiation area of a quadrangle having a small aspect ratio (for example the aspect ratio of not less than 1 and less than 2). FIG. 3 is an example showing the modified configuration of the resistor string of the DAC shown in FIG. 1. A resistor string 511 comprises a plurality of resistors R11 to R26 connected in series with each other through a plurality of folded parts. The resistors R11 to R26 are all disposed within an irradiation area of a planar laser beam (hereinafter referred to as a planar laser irradiation area) 519.

Accordingly, in the formation of the resistor string 511, all the forming parts of the resistors R11 to R26 are crystallized with one laser shot. Accordingly, all the resistors R11 to R26 are uniformly crystallized, and the formed resistors R11 to R26 can obtain sufficient relative accuracy.

Figure 4:
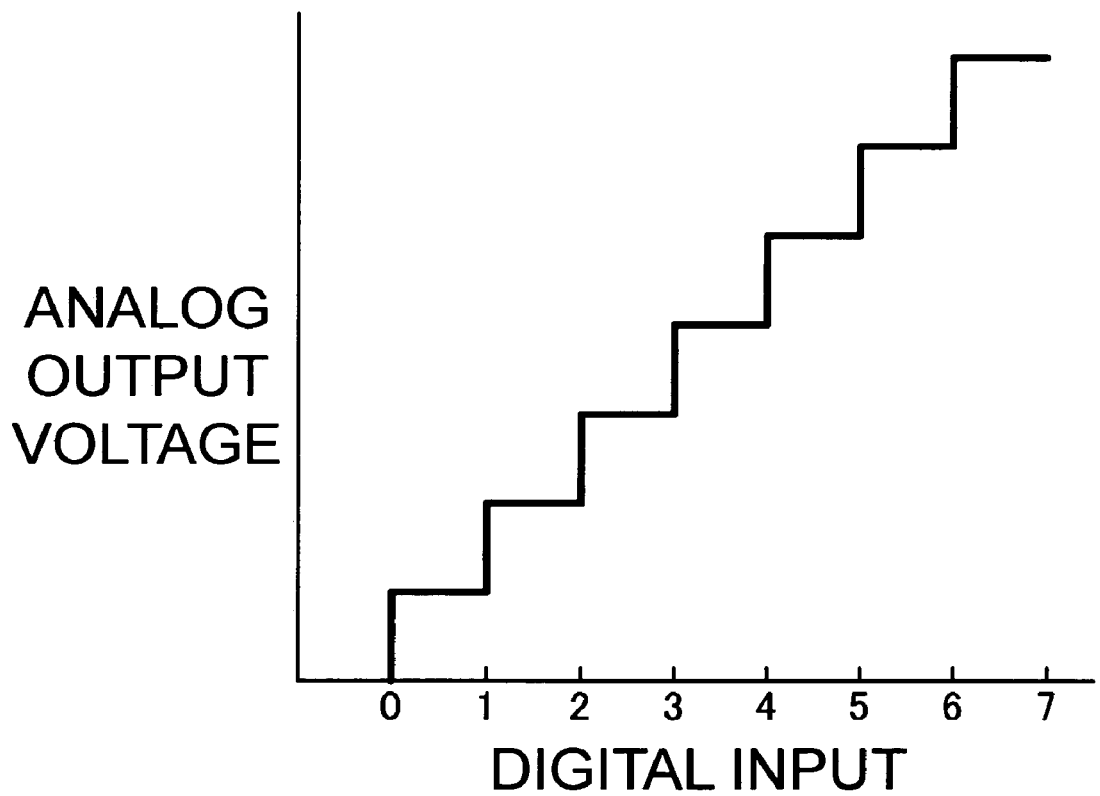
FIG. 4 is a chart showing an input-output characteristic of the DAC shown in FIG. 1.

FIG. 4 is a chart showing an input-output characteristic of the DAC shown in FIG. 1. It can be seen that, a sufficient linearity of an analog output voltage is obtained corresponding to a digital input.

According to the above-described configuration of the resistors, the resistor string 11 is disposed within the predetermined linear laser irradiation area 19 when a linear laser beam is employed, while the resistor string 511 is disposed within the planar laser irradiation area 519 when a planer laser beam is employed, thus all the resistors configuring the resistor string can be crystallized with the same laser shot or one laser shot. However, in some DACs in which data is required to be processed with higher accuracy, the number of resistors configuring the resistor string is increased, thus it is difficult to dispose all the resistors within the area which enables laser irradiation with the same shot or one shot. In such a case, the following configuration of a DAC and crystallization of each resistor can be employed.

Figure 5:
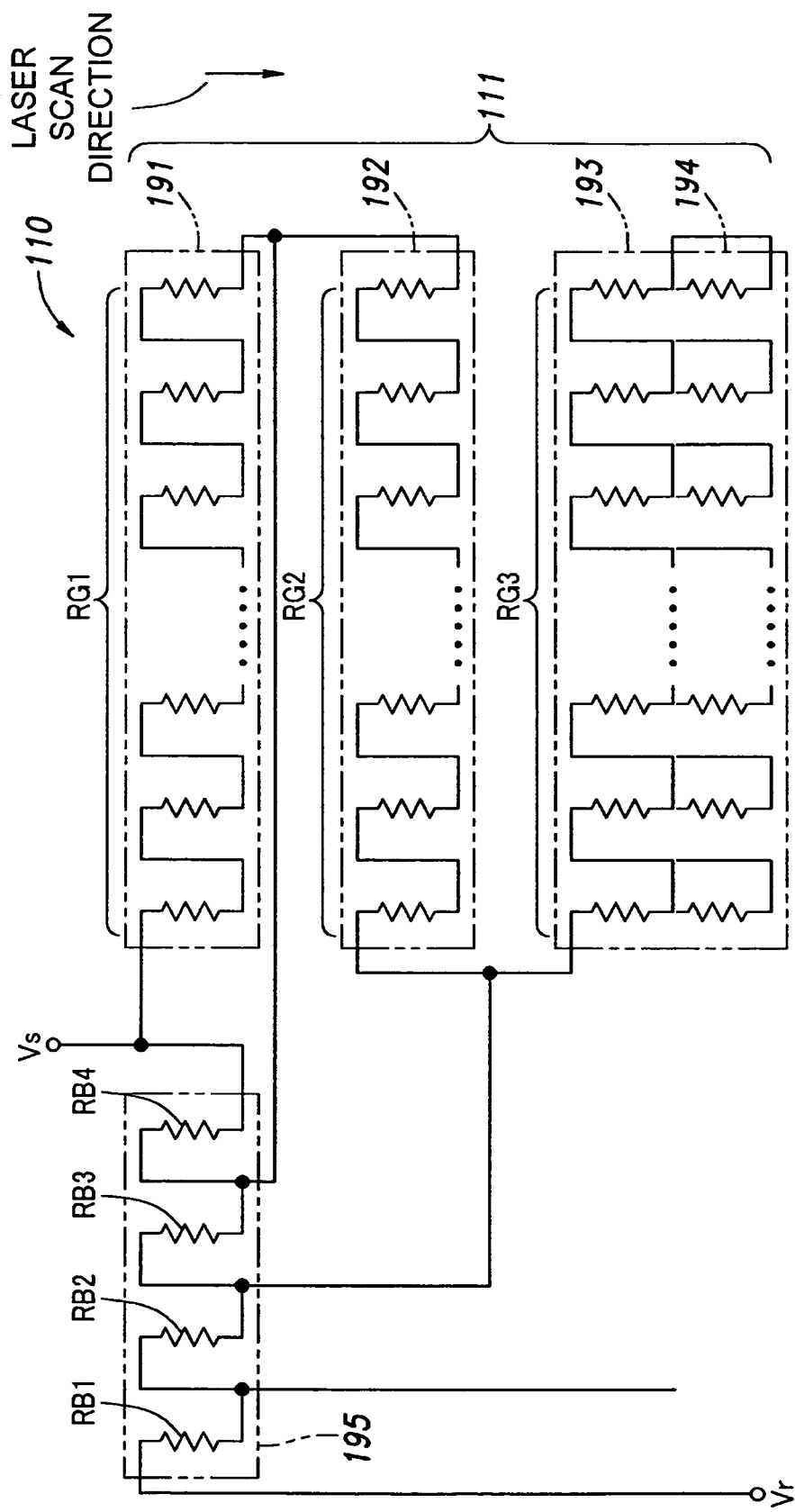
FIG. 5 is a pattern diagram showing the configuration of a DAC as an embodiment of the invention.

FIG. 5 is a diagram showing the schematic configuration of a DAC as an embodiment of the invention. A DAC 110 comprises a resistor string 111 which includes a plurality of resistor groups RG1 to RG4 connected in series with each other through a plurality of folded parts between reference voltages Vr and Vs. The resistor string 111 comprises a plurality of auxiliary resistors RB1 to RB4 each connected in parallel with a plurality of resistors that are connected in series with each other to configure each of the resistor groups RG1 to RG4. It is to be noted that, although the DAC 110 further comprises a switch array as well as FIG. 1 and other constituent elements which are included in conventional DAC, they are omitted here.

The resistor groups RG1 to RG4 are disposed within linear laser irradiation areas 191 to 194 respectively, and the auxiliary resistors RB1 to RB4 are all disposed within a linear laser irradiation area 195. Also, each of the auxiliary resistors RB1 to RB4 has the same resistance value, which is sufficiently smaller than the combined resistance value of each resistor group RG1 to RG4 (namely, the combined resistance value of the resistors configuring each resistor group) that are connected with the auxiliary resistors RB1 to RB4. Typically, the ratio of the combined resistance value of the resistor group to the resistance value of the auxiliary resistor is 10:1 or more.

According to the above-described DAC 110, a plurality of resistors which are connected in series with each other to configure each resistor group RG1 to RG4 are connected in parallel with each auxiliary resistor group RB1 to RB4 which has the sufficiently smaller resistance value than the combined resistance value of each resistor group, thus the resistance value between both ends of each resistor group RG1 to RG4 (namely, the combined resistance value of the series-connected resistors and the auxiliary resistor connected in parallel with the resistors) is determined by the resistance value of the auxiliary resistor in practice. In addition, by setting the resistance value of each auxiliary resistor at the same guaranteed value in advance, the resistance value between both ends of each resistor group RG1 to RG4 can roughly have the same value. Further, as the resistance value of each resistor in the same resistor group is identical to each other, sufficient linearity can be obtained in an output voltage which is from the connection node of each resistor, and more accurate D/A conversion can thus be obtained.

It is to be noted that, shown in this embodiment is an example in which each of the auxiliary resistors RG1 to RG4 is formed on the same semiconductor thin film as the other resistors and switch array, however, the invention is not specifically limited to this and the auxiliary resistors can be externally attached externally, not on the semiconductor thin film. In this case, the resistance value of each auxiliary resistor can be easily set at the same guaranteed value in advance.

In the formation of the above-described resistor string 111, forming parts of the plurality of the resistors configuring each resistor group RG1 to RG4 are disposed. The configuration of them is roughly the same as that in FIG. 1. In this embodiment, all the forming parts of the resistors configuring the same resistor group are disposed within each of the predetermined linear laser irradiation areas 191 to 194. Also, forming parts of the plurality of the auxiliary resistors RB1 to RB4 are all disposed within the predetermined linear laser irradiation area 195 so as to be connected in parallel with the series-connected resistors which configure each resistor group RG1 to RG4.

Next, the forming parts of each resistor group RG1 to RG4 which is disposed within each linear laser irradiation area 191 to 194 is irradiated with the same linear laser shot, while scanning the laser beam in the fixed direction (direction of an arrow in FIG. 5). Similarly, each forming part of the auxiliary resistors RB1 to RB4 is irradiated with the same linear laser shot.

It is to be noted that, the configurations of the resistor groups RG1 to RG4 and the auxiliary resistors RB1 to RB4 shown in FIG. 5 is only an example, and various modifications can be made as far as they are connected in such a manner that they can, at least, implement the above objects. In addition, when the auxiliary resistors are externally attached as described above, the steps for forming of the auxiliary resistors RB1 to RB4 can be omitted.

In this manner, the forming parts of the resistors within the laser irradiation area can be irradiated with the same linear laser shot, however, as irradiation characteristics of a laser beam is peculiar to a laser irradiation apparatus which is used, the configuration of the resistors in the resistor strings which are uniformly crystallized is not limited to the one shown in FIG. 5.

Figure 6:
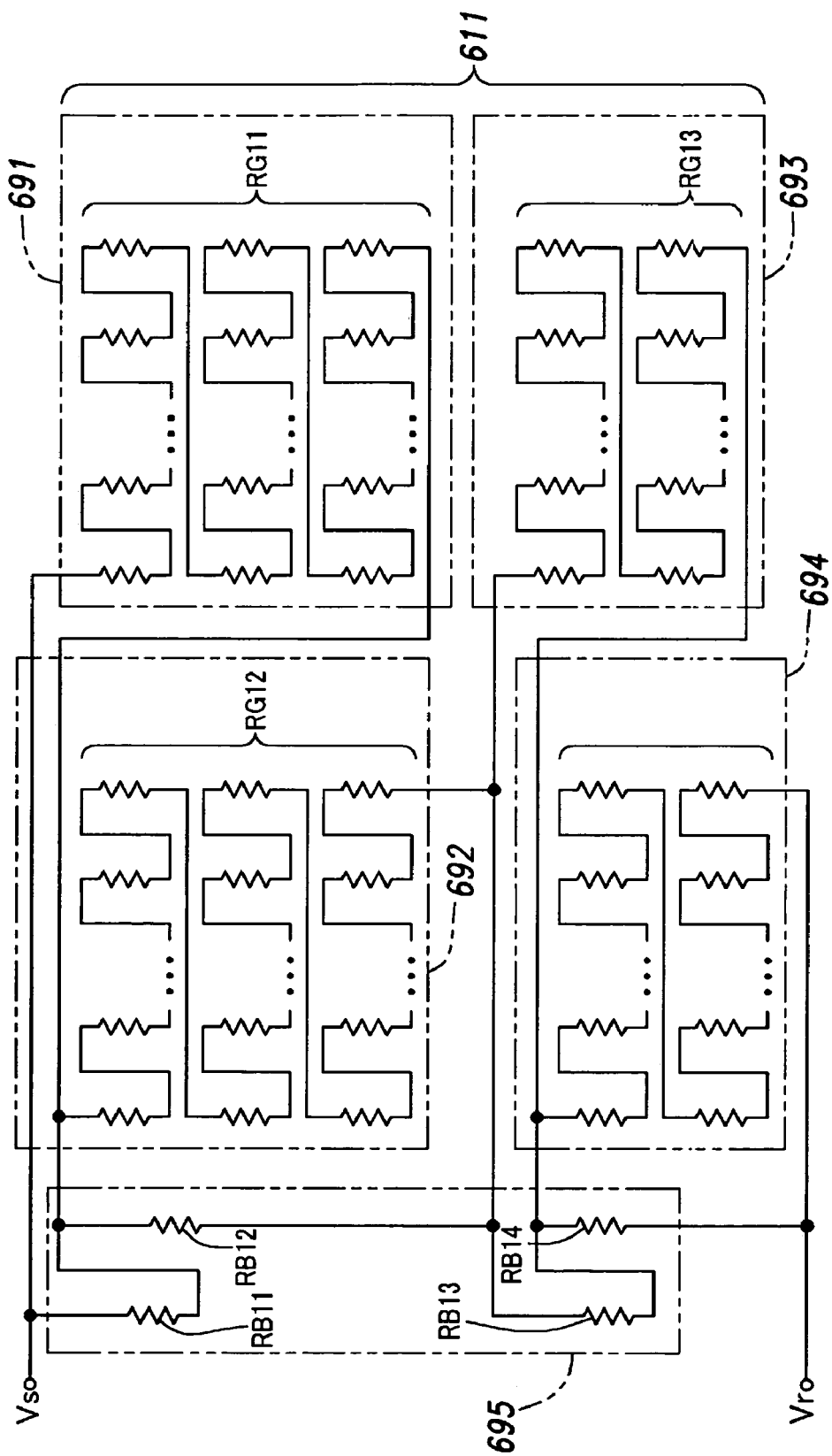
FIG. 6 is a diagram showing a modified example of the resistor string of the DAC shown in FIG. 5.

Now, an example, in which a planar laser beam capable of crystallizing a square or a close-square rectangular area with one shot in place of the above-described linear laser beam, is shown. FIG. 6 is an example showing the modified configuration of the resistor string of the DAC shown in FIG. 5. The resistor string 611 comprises a plurality of resistor groups RG11 to RG14 which are connected in series with each other through a plurality of folded parts. The resistor string 611 further comprises a plurality of auxiliary resistors RB11 to RB14 which are connected in parallel with the series-connected resistors in each of the resistor groups RG11 to RG14.

The resistor groups RG11 to RG14 are disposed within planar laser irradiation areas 691 to 694 respectively, and the auxiliary resistors RB11 to RB14 are all disposed within a planar laser irradiation area 695. Thus, in the formation of the resistor string 611, each forming part of the resistors in each resistor group RG11 to RG14 and each formation part of the auxiliary resistors RB11 to RB14 are crystallized with one laser shot respectively. Accordingly, all the resistors in the resistor groups RG11 to RG14 and the auxiliary resistors RB11 to RB14 are each crystallized with uniformity.

Figure 7:
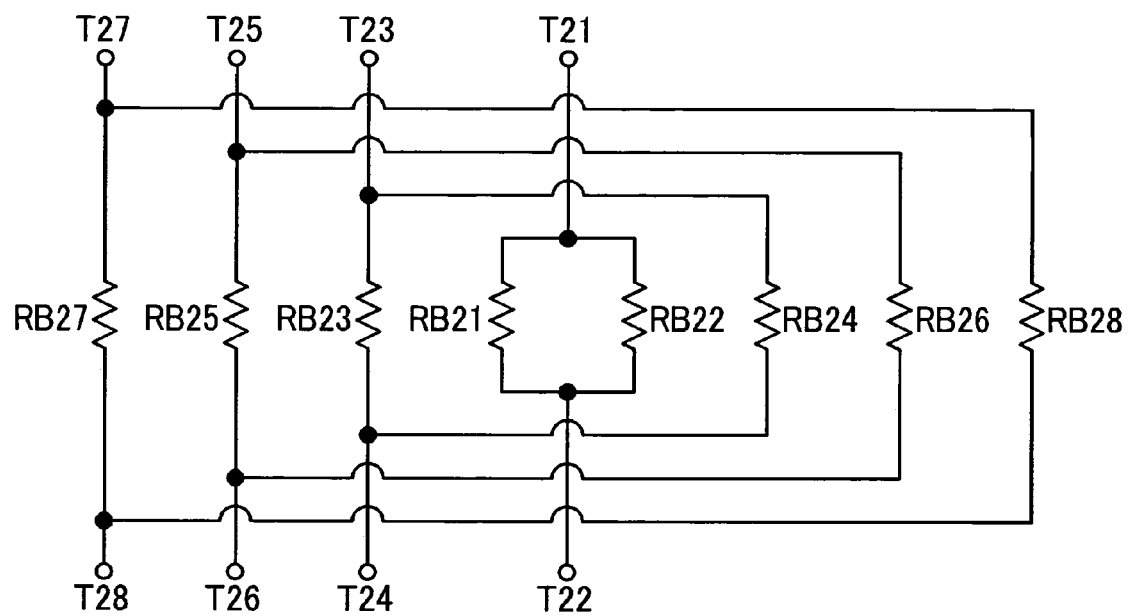
FIG. 7 is a diagram showing a modified example of the auxiliary resistors of the DAC shown in FIG. 5.

FIG. 7 is a diagram showing a modified example of the auxiliary resistors shown in FIG. 5. The configuration shown in FIG. 7 comprises four pairs of auxiliary resistors each connected in parallel with each other (RB21, RB22), (RB23, RB24), (RB25, RB26), and (RB27, RB28) in place of the auxiliary resistors RB1 to RB4 shown in FIG. 5. These auxiliary resistors are, in the same manner as in FIG. 5, connected in series with each pair through their respective terminals (T21, T22), (T23, T24) (T25, T26), and (T27, T28), and connected in parallel with the resistor groups RG1 to RG4 respectively. Each of the auxiliary resistors RB21 to RB28 roughly has the same resistance value, which is sufficiently smaller than the combined resistance value of each resistor group to which the auxiliary resistor is connected. Accordingly, even when some manufacturing errors occur in the resistance value of the auxiliary resistors configuring each pair, the resistance-value (combined resistance) can be set more accurate by the averaging effect of the combined resistance.

It is to be noted that, each of the auxiliary resistors RB21 to RB28 may be disposed within a predetermined linear laser irradiation area so as to irradiate the same linear laser shot in the same manner as the auxiliary resistors RB1 to RB4 described above. In addition, by increasing the number of the auxiliary resistors configuring each pair, the combined resistance can further be averaged.

Figure 8:
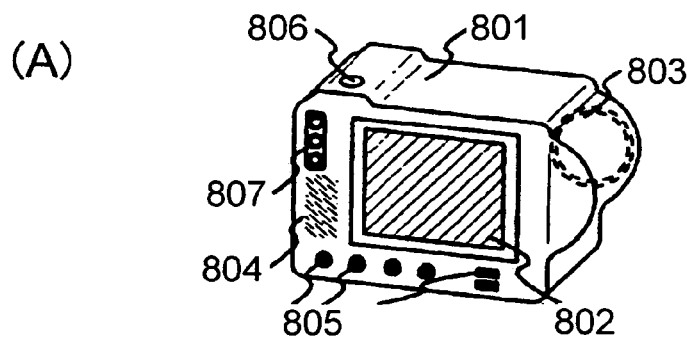
FIGS. 8A to 8G are examples of electronic devices each provided with the DAC of the invention.
Figure 8:
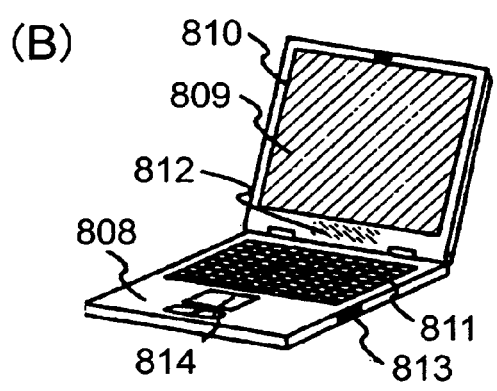
Figure 8:
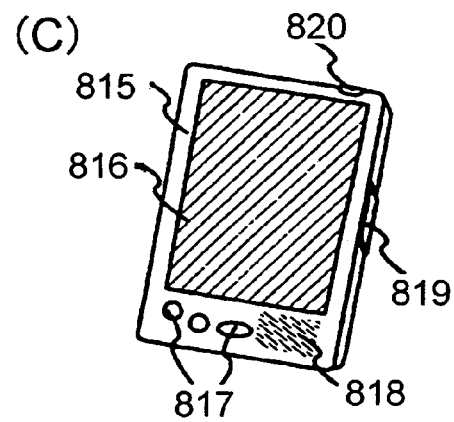
Figure 8:
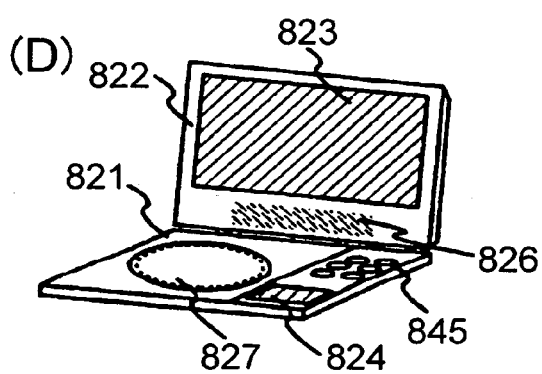
Figure 8:
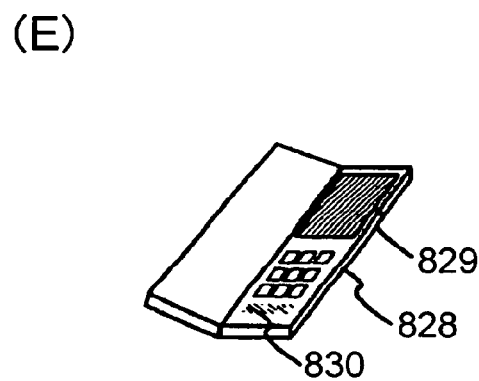
Figure 8:
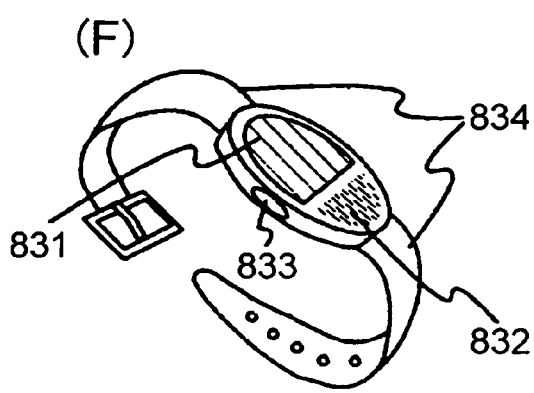
Figure 8:
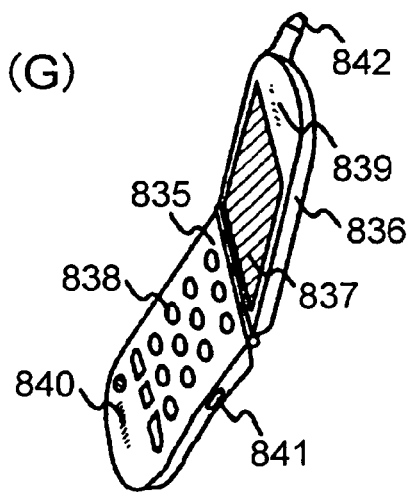
Figure 9:
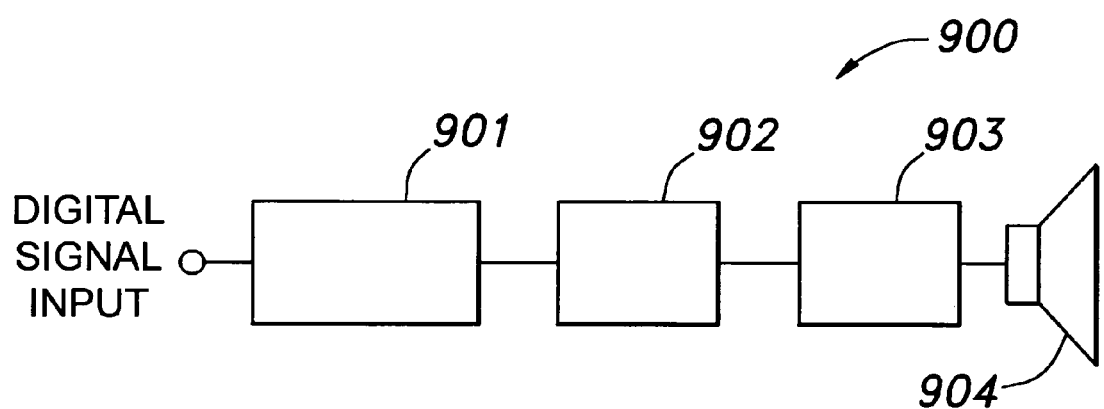
FIG. 9 is an example of an audio system which employs the DAC of the invention.
Figure 10:
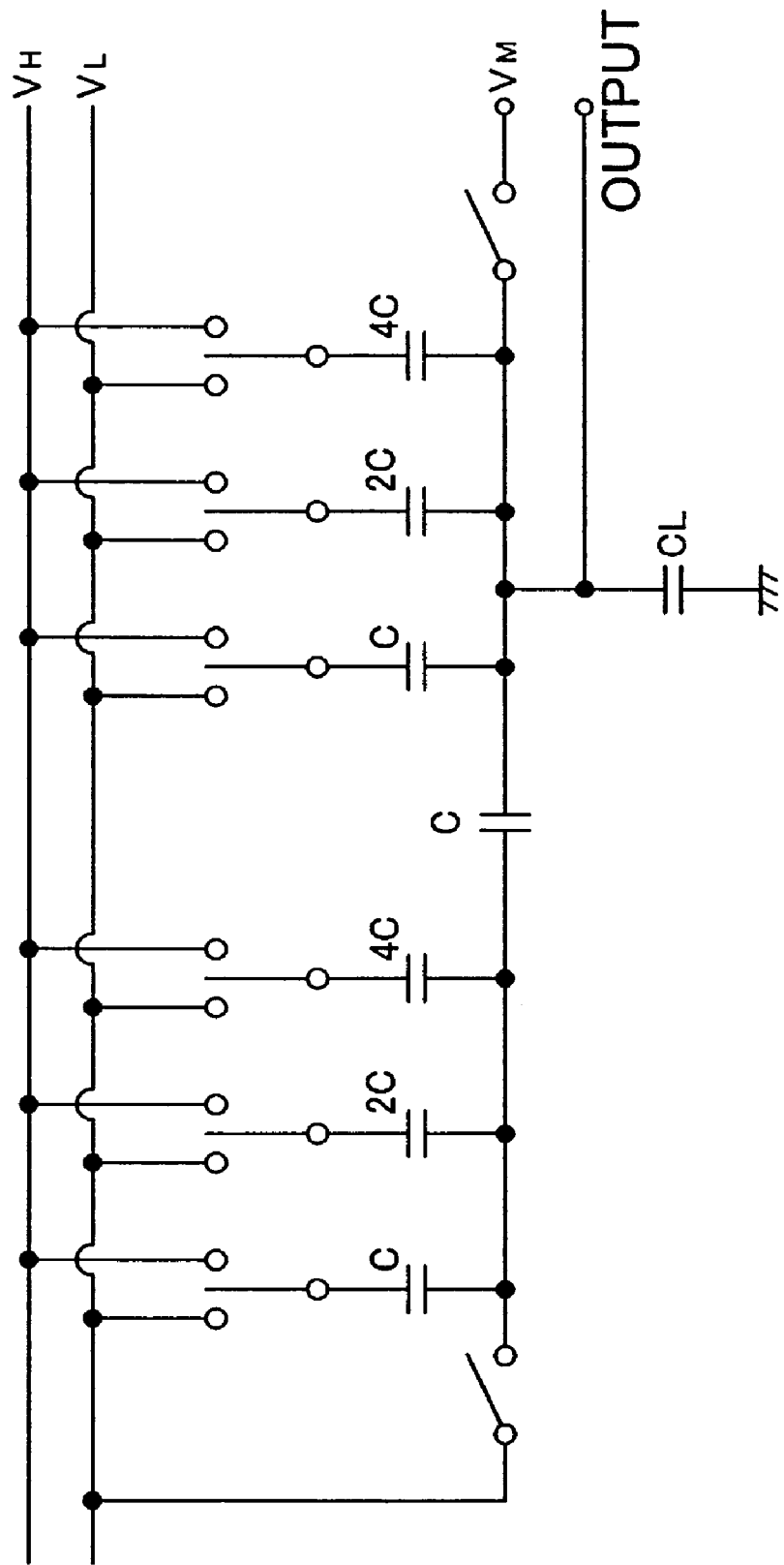
FIG. 10 is a pattern diagram showing the configuration of a conventional DAC.
Figure 11:
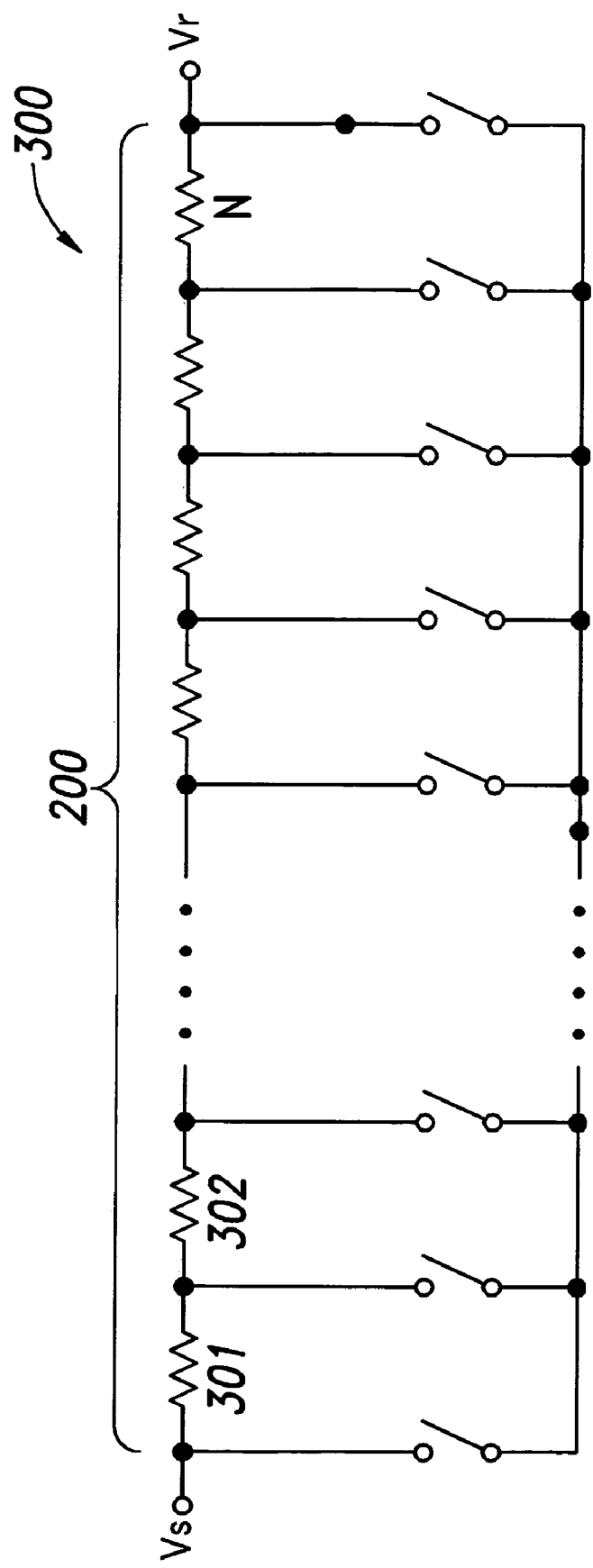
FIG. 11 is a pattern diagram showing the configuration of a resistor string in the conventional resistor string DAC.
Figure 12:
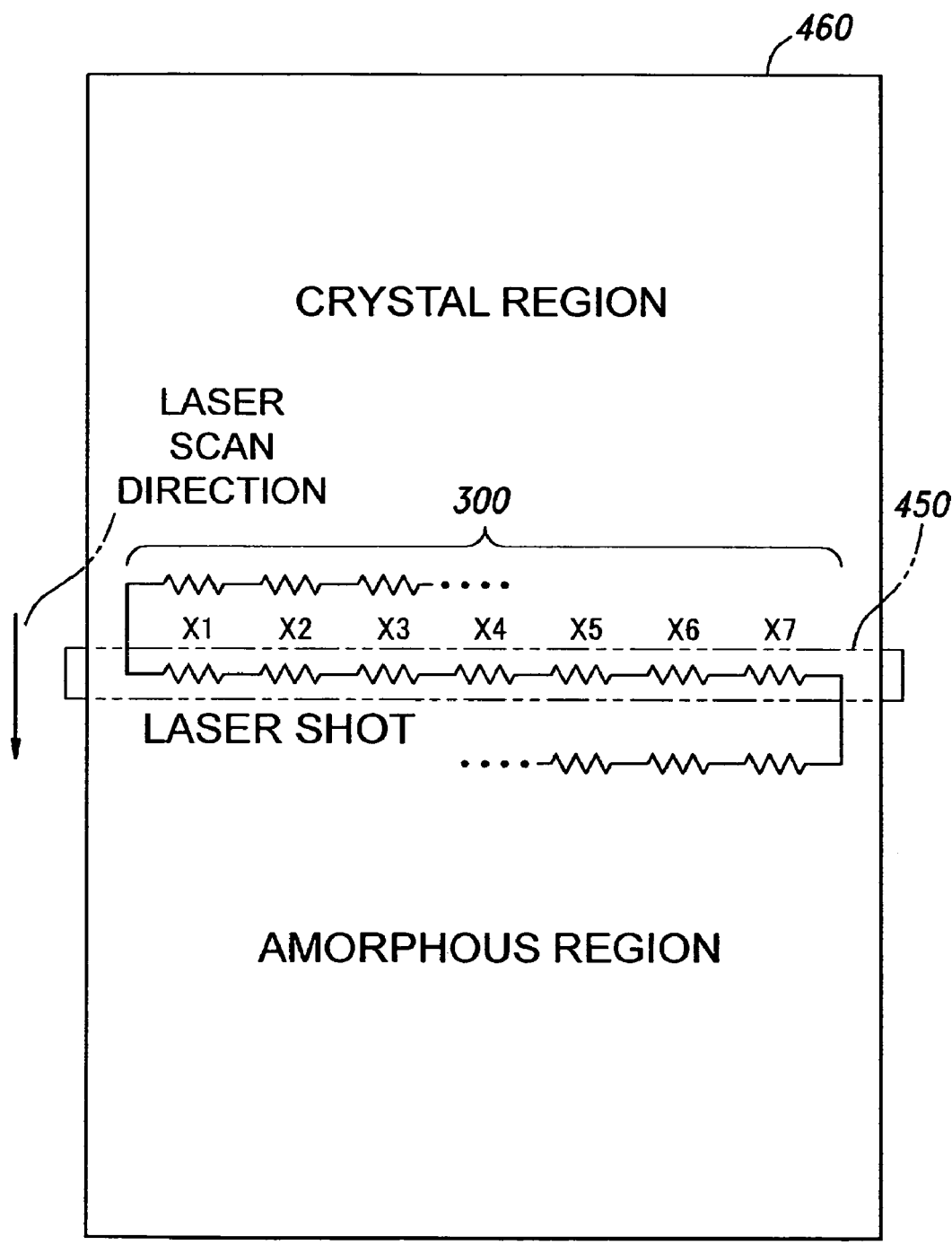
FIG. 12 is a pattern diagram showing a method for forming resistors on a semiconductor film by laser irradiation.
Figure 13:
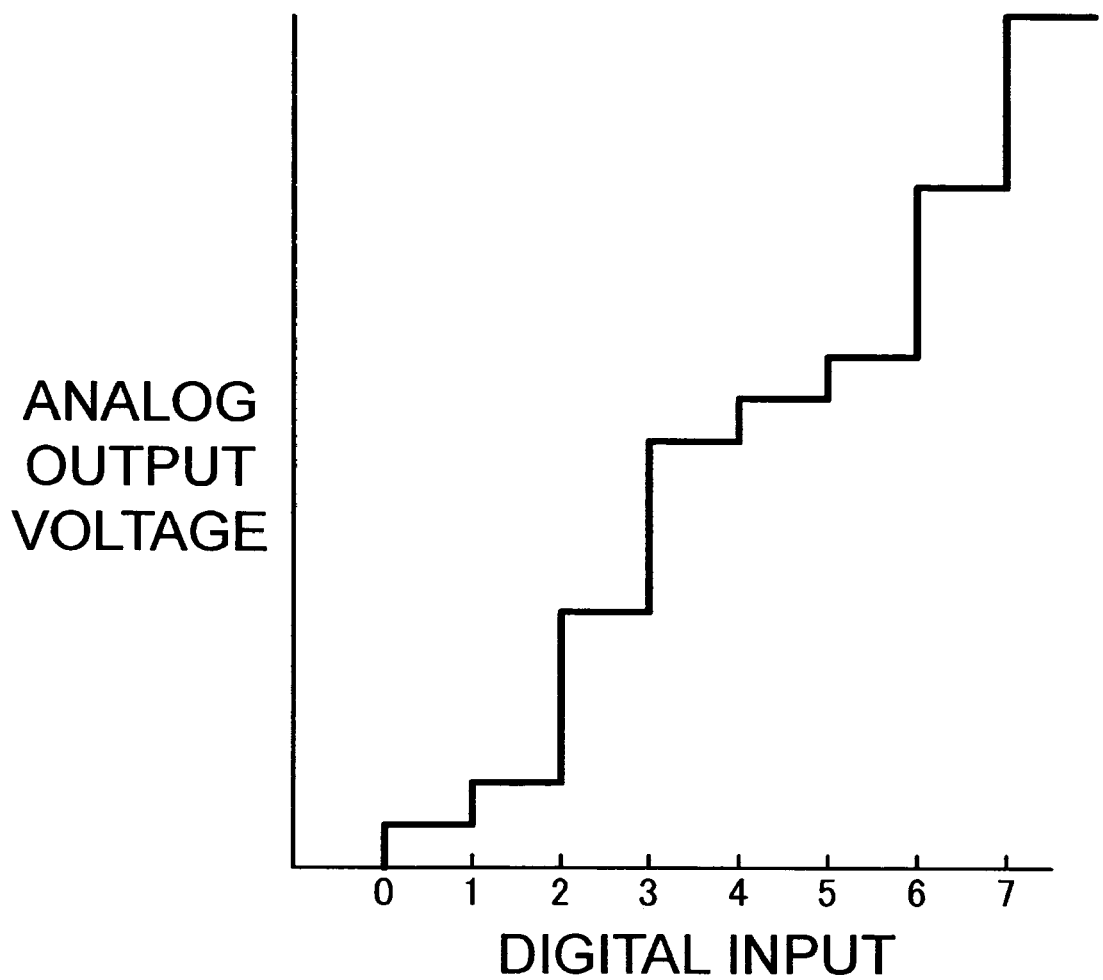
FIG. 13 is a chart showing an input-output characteristic of a DAC shown in FIG. 12.

The configuration of the DAC and its manufacturing method of the invention can be applied to a semiconductor device capable of incorporating these kinds of DACs. It is to be noted that, the semiconductor device in this specification refers to all devices that can operate by utilizing semiconductor characteristics such as an electro-optic device, a semiconductor circuit, and an electronic device incorporating them. FIGS. 8A to 8G show specific examples of an electronic apparatus comprising the DAC of the invention. FIG. 8A shows a digital camera comprising a main body 801, a display potion 802, a picture receive portion 803, an audio output portion 804, control keys 805, a shutter 806, and an external connection port 807. FIG. 8B shows a mobile computer comprising a main body 808, a display portion 809, a casing 810, a key board 811, an audio output portion 812, an external connection port 813, and a pointing mouse 814. FIG. 8C shows a personal digital assistant comprising a main body 815, a display portion 816, control keys 817, an audio output portion 818, an infra red signal portion 819, and a switching portion 820. FIG. 8D shows a player comprising a main body 821, a casing 822, a display portion A 823, a display portion B 824, control keys 825, an audio output portion 826, and a recording media reading port 827. FIG. 8E shows a mobile computer comprising a main body 828, a display portion 829, and an audio output portion 830. FIG. 8F shows a watch comprising a display portion 831, an audio output portion 832, a control switch 833, and a belt 834. FIG. 8G shows a cellular phone comprising a main body 835, a casing 836, a display portion 837, control keys 838, an audio output port 839, an audio, input port 840, an external connection port 841, and an antena 842. As shown in the figure, such an electronic apparatus includes a video camera, a personal computer, a PDA, a mobile computer, a watch, a cellular phone, and the like. The DAC of the invention can be used in an audio output portion in each apparatus. FIG. 9 shows an embodiment of an audio system which employs the DAC of the invention. An audio system 900 is inputted with a digital audio signal. This signal is processed in a digital signal processing circuit 901. Processing such as data compression and extension filtering is carried out in the digital signal processing circuit 901, however, the invention is not particularly limited to this. Subsequently, the digital signal is converted into an analog signal in a DAC 902 of the invention. Then, it is amplified in an analog amplifier 903 so as to drive a speaker 904. It is to be noted that, although a liquid crystal material is mainly used as a display portion in such an electronic apparatus as described above, however, the invention is not specifically limited to this and other materials that are known to those skilled in the art can be employed as long as they have the similar display function.

As described above, according to the invention, relative accuracy of the resistance value of resistors configuring a resistor string can be improved. As a result, in a DAC, a sufficient linearity can be obtained in an analog output voltage that is from the connection node of each resistor corresponding to a digital input, thus highly accurate data processing can be enabled even in the case of processing data of larger bits.

What is claimed is:

1. A manufacturing method of a D/A converter circuit, comprising the steps of:
   forming a resistor string which includes a plurality of resistors connected in series between reference voltages;
   forming a plurality of switching elements, each of the plurality of switching elements being connected with a connection node of corresponding one of the plurality of resistors;
   disposing all forming parts of the resistors configuring the resistor string within a laser irradiation area; and
   crystallizing all the forming parts of the resistors which are disposed within the laser irradiation area with a same laser shot, wherein each of the resistors is a thin film element crystallized by linear laser irradiation.

2. The manufacturing method of a D/A converter circuit according to claim 1, wherein each forming part of the resistors is disposed to be parallel with each other, and also to be parallel with a scan direction of the linear laser irradiation.

3. The manufacturing method of a D/A converter circuit according to claim 1, wherein each forming part of the resistors is all formed to have a same shape.

4. A manufacturing method of a D/A converter circuit, comprising the steps of:
   forming a resistor string which includes a plurality of resistor groups connected in series between reference voltages;
   forming a plurality of resistors which are connected in series to configure each of the resistor groups;
   forming a plurality of switching elements, each of the plurality of switching elements being connected with a connection node of corresponding one of the plurality of resistors;
   disposing forming parts of the series-connected resistors of each resistor group within each different laser irradiation area;
   crystallizing all the forming parts of the resistors which are disposed within the laser irradiation area with a same laser shot; and
   disposing auxiliary resistors so as to be connected in parallel with each resistor group,
   wherein each of the resistors is a thin film element crystallized by linear laser irradiation;
   wherein each of the auxiliary resistors has a same resistance value that is sufficiently smaller than a combined resistance value of the resistor group to which each auxiliary resistor is connected.

5. The manufacturing method of a D/A converter circuit according to claim 4, wherein:
   each of the auxiliary resistors is a thin film element crystallized by laser irradiation;
   all forming parts of the auxiliary resistors are disposed within a laser irradiation area; and
   all the forming parts of the auxiliary resistors which are disposed within the laser irradiation area are crystallized with a same laser shot.

6. The manufacturing method of a D/A converter circuit according to claim 4, wherein each forming part of the resistors is disposed to be parallel with each other, and also to be parallel with a scan direction of the linear laser irradiation.

7. The manufacturing method of a D/A converter circuit according to claim 4, wherein each forming part of the resistors is all formed to have a same shape.

8. A manufacturing method of a D/A converter circuit, comprising the steps of:
   forming a resistor string which includes a plurality of resistors connected in series between reference voltages;
   forming a plurality of switching elements, each of the plurality of switching elements being connected with a connection node of corresponding one of the plurality of resistors;
   disposing all forming parts of the resistors configuring the resistor string within a laser irradiation area; and
   crystallizing all the forming parts of the resistors which are disposed within the laser irradiation area with one laser shot,
   wherein each of the resistors is a thin film element crystallized by linear laser irradiation.

9. The manufacturing method of a D/A converter circuit according to claim 8, wherein each forming part of the resistors is disposed to be parallel with each other.

10. The manufacturing method of a D/A converter circuit according to claim 8, wherein each forming part of the resistors is all formed to have a same shape.

11. A manufacturing method of a D/A converter circuit, comprising the steps of:
    forming a resistor string which includes a plurality of resistor groups connected in series between reference voltages;
    forming a plurality of resistors which are connected in series to configure each of the resistor groups;
    forming a plurality of switching elements, each of the plurality of switching elements being connected with a connection node of corresponding one of the plurality of resistors;
    disposing forming parts of the series-connected resistors of each resistor group within each different laser irradiation area;
    crystallizing all the forming parts of the resistors which are disposed within the laser irradiation area with one laser shot;
    disposing auxiliary resistors so as to be connected in parallel with each resistor group,
    wherein each of the resistors is a thin film element crystallized by linear laser irradiation;
    wherein each of the auxiliary resistors has a same resistance value that is sufficiently smaller than a combined resistance value of the resistor group to which each auxiliary resistor is connected.

12. The manufacturing method of a D/A converter circuit according to claim 11, wherein:
    each of the auxiliary resistors is a thin film element crystallized by laser irradiation;
    all forming parts of the auxiliary resistors are disposed within a laser irradiation area; and
    all the forming parts of the auxiliary resistors which are disposed within the laser irradiation area are crystallized with one laser shot.

13. The manufacturing method of a D/A converter circuit according to claim 11, wherein each forming part of the resistors is disposed to be parallel with each other.

14. The manufacturing method of a D/A converter circuit according to claim 11, wherein each forming part of the resistors is all formed to have a same shape.

15. A manufacturing method of a semiconductor device incorporating a D/A converter circuit, comprising the steps of:
    forming a resistor string which includes a plurality of resistors connected in series between reference voltages;
    forming a plurality of switching elements, each of the plurality of switching elements being connected with a connection node of corresponding one of the plurality of resistors;
    disposing all forming parts of the resistors configuring the resistor string within a laser irradiation area; and
    crystallizing all the forming parts of the resistors which are disposed within the laser irradiation area with a same laser shot,
    wherein each of the resistors is a thin film element crystallized by linear laser irradiation.

16. The manufacturing method of a semiconductor device incorporating a D/A converter circuit according to claim 15, wherein each forming part of the resistors is disposed to be parallel with each other, and also to be parallel with a scan direction of the linear laser irradiation.

17. The manufacturing method of a semiconductor device incorporating a D/A converter circuit according to claim 15, wherein each forming part of the resistors is all formed to have a same shape.

18. A manufacturing method of a semiconductor device incorporating a D/A converter circuit, comprising the steps of:
   forming a resistor string which includes a plurality of resistor groups connected in series between reference voltages;
   forming a plurality of resistors so as to be connected in series to configure each of the resistor groups;
   forming a plurality of switching elements, each of the plurality of switching elements being connected with a connection node of corresponding one of the plurality of resistors;
   disposing forming parts of the series-connected resistors of each resistor group within each different laser irradiation area;
   crystallizing all the forming parts of the resistors which are disposed within the laser irradiation area with a same laser shot; and
   disposing auxiliary resistors so as to be connected in parallel with each resistor group,
   wherein each of the resistors is a thin film element crystallized by linear laser irradiation;
   wherein each of the auxiliary resistors has a same resistance value that is sufficiently smaller than a combined resistance value of the resistor group to which each auxiliary resistor is connected.

19. The manufacturing method of a semiconductor device incorporating a D/A converter circuit according to claim 18, wherein:
   each of the auxiliary resistors is a thin film element crystallized by laser irradiation;
   all forming parts of the auxiliary resistors are disposed within a laser irradiation area; and
   all the forming parts of the auxiliary resistors which are disposed within the laser irradiation area are crystallized with a same laser shot.

20. The manufacturing method of a semiconductor device incorporating a D/A converter circuit according to claim 18, wherein each forming part of the resistors is disposed to be parallel with each other, and also to be parallel with a scan direction of the linear laser irradiation.

21. The manufacturing method of a semiconductor device incorporating a D/A converter circuit according to claim 18, wherein each forming part of the resistors is all formed to have a same shape.

22. A manufacturing method of a semiconductor device incorporating a D/A converter circuit, comprising the steps of:
   forming a resistor string which includes a plurality of resistors connected in series between reference voltages;
   forming a plurality of switching elements, each of the plurality of switching elements being connected with a connection node of corresponding one of the plurality of resistors;
   disposing all forming parts of the resistors configuring the resistor string within a laser irradiation area; and
   crystallizing all the forming parts of the resistors which are disposed within the laser irradiation area with one laser shot,
   wherein each of the resistors is a thin film element crystallized by linear laser irradiation.

23. The manufacturing method of a semiconductor device incorporating a D/A converter circuit according to claim 22, wherein each forming part of the resistors is disposed to be parallel with each other.

24. The manufacturing method of a semiconductor device incorporating a D/A converter circuit according to claim 22, wherein each forming part of the resistors is all formed to have a same shape.

25. A manufacturing method of a semiconductor device incorporating a D/A converter circuit, comprising the steps of:
   forming a resistor string which includes a plurality of resistor groups connected in series between reference voltages;
   forming a plurality of switching elements, each of the plurality of switching elements being connected with a connection node of corresponding one of the plurality of resistors;
   disposing forming parts of the series-connected resistors of each resistor group within each different laser irradiation area;
   crystallizing all the forming parts of the resistors which are disposed within the laser irradiation area with one laser shot; and
   disposing auxiliary resistors so as to be connected in parallel with each resistor group,
   wherein each of the resistors is a thin film element crystallized by linear laser irradiation;
   wherein each of the auxiliary resistors has a same resistance value that is sufficiently smaller than a combined resistance value of the resistor group to which each auxiliary resistor is connected.

26. The manufacturing method of a semiconductor device incorporating a D/A converter circuit according to claim 25, wherein:
   each of the auxiliary resistors is a thin film element crystallized by laser irradiation;
   all forming parts of the auxiliary resistors are disposed within a laser irradiation area; and
   all the forming parts of the auxiliary resistors which are disposed within the laser irradiation area are crystallized with one laser shot.

27. The manufacturing method of a semiconductor device incorporating a D/A converter circuit according to claim 25, wherein each forming part of the resistors is disposed to be parallel with each other.

28. The manufacturing method of a semiconductor device incorporating a D/A converter circuit according to claim 25, wherein each forming part of the resistors is all formed to have a same shape.

* * * * *